United States Patent
Sadhasivan et al.

(10) Patent No.: US 7,062,616 B2
(45) Date of Patent: Jun. 13, 2006

(54) IMPLEMENTING A DUAL PARTITION FLASH WITH SUSPEND/RESUME CAPABILITIES

(75) Inventors: Akila Sadhasivan, El Dorado Hills, CA (US); Richard P. Garner, Cameron Park, CA (US)

(73) Assignee: Intel Corporation, Santa Clara, CA (US)

( * ) Notice: Subject to any disclaimer, the term of this patent is extended or adjusted under 35 U.S.C. 154(b) by 204 days.

(21) Appl. No.: 09/880,404

(22) Filed: Jun. 12, 2001

(65) Prior Publication Data

US 2002/0188812 A1    Dec. 12, 2002

(51) Int. Cl.
*G06F 13/00*    (2006.01)

(52) U.S. Cl. .................. 711/153; 711/173; 365/185.11; 365/185.33

(58) Field of Classification Search ............... 711/150, 711/170, 173, 100, 103, 153; 365/185.11, 365/185.33, 185
See application file for complete search history.

(56) References Cited

U.S. PATENT DOCUMENTS

| | | | | |
|---|---|---|---|---|
| 5,337,275 A | * | 8/1994 | Garner | 365/189.01 |
| 5,603,036 A | * | 2/1997 | Wells et al. | 713/322 |
| 5,696,977 A | * | 12/1997 | Wells et al. | 713/322 |
| 5,822,244 A | * | 10/1998 | Hansen et al. | 365/185.11 |
| 5,937,424 A | * | 8/1999 | Leak et al. | 711/103 |
| 5,940,861 A | * | 8/1999 | Brown et al. | 711/154 |
| 6,088,264 A | * | 7/2000 | Hazen et al. | 365/185.11 |
| 6,148,360 A | * | 11/2000 | Leak et al. | 710/260 |
| 6,182,189 B1 | * | 1/2001 | Alexis et al. | 711/103 |
| 6,189,070 B1 | * | 2/2001 | See et al. | 711/103 |
| 6,201,739 B1 | * | 3/2001 | Brown et al. | 365/185.29 |
| 6,377,486 B1 | * | 4/2002 | Lee | 365/185.11 |

* cited by examiner

*Primary Examiner*—Reba I. Elmore
(74) *Attorney, Agent, or Firm*—Blakely, Sokoloff, Taylor & Zafman LLP

(57) ABSTRACT

A method of performing multiple operations on a flash memory device is described. This is made possible through the implementation of multiple partitions within the flash memory. The partitions are used to store data, application code, and system code. Low level functions within the system code process the data and handle preemption functions within the flash memory.

16 Claims, 4 Drawing Sheets

20

| PREEMPTED \ PREEMPTING | RECLAIM ERASE | RECLAIM WRITE | BACKGROUND WRITE | RECLAIM LOAD | BACKGROUND READ | FOREGROUND READ |
|---|---|---|---|---|---|---|
| RECLAIM ERASE | T | T | V | T | V | V |
| RECLAIM WRITE | T | S,T | S | T | V | V |
| BACKGROUND WRITE | P | S,P | S,T | P | T | V |
| RECLAIM READ | T | T | V | T | V | V |
| BACKGROUND READ | P | P | T | P | T | V |
| FOREGROUND READ | P | P | P | P | P | S |

| PREEMPTING 22 / 21 PREEMPTED | RECLAIM ERASE | RECLAIM WRITE | BACKGROUND WRITE | RECLAIM LOAD | BACKGROUND READ | FOREGROUND READ |
|---|---|---|---|---|---|---|
| RECLAIM ERASE | T | T | V | T | V | V |
| RECLAIM WRITE | T | S,T | S | T | V | V |
| BACKGROUND WRITE | P | S,P | S,T | P | T | V |
| RECLAIM READ | T | T | V | T | V | V |
| BACKGROUND READ | P | P | T | P | T | V |
| FOREGROUND READ | P | P | P | P | P | S |

FIG. 2

IMPLEMENTING A DUAL PARTITION FLASH WITH SUSPEND/RESUME CAPABILITIES

FIELD OF THE INVENTION

The present invention pertains to the field of flash memory. More particularly, the present invention relates to a method of implementing a read while write solution in flash to improve performance by eliminating a need for accessing random access memory to execute low level functions.

BACKGROUND OF THE INVENTION

Flash memory is used in a wide variety of products including many types of computing, communication, and consumer electronic devices. Flash memory is a type of nonvolatile memory. Flash memory has been used as file systems for storing data. One such system is the Flash Data Integrator (FDI), which has been used in cell phones and other electronic devices.

The FDI is intended to fully support numerous applications. The FDI can be used to store both code and data. Typically, the FDI code will include low level functions, which perform write and erase operations of the FDI data. Write and erase operations in flash occurs through the low level functions.

Flash consists of multiple modes such as status, read, and write/erase. The flash is set to a specific mode depending on what operation needs to be executed. For example, before an erase operation can be performed, the flash is required to be switched to the write/erase mode. In order to read code from the FDI, the flash needs to be in the read mode. When reading the code, data operations can be performed at the same time by downloading the low level functions that perform write and erase to data into random access memory (RAM).

Unlike flash, which has different modes, RAM is typically in read mode all the time. By downloading the low level functions that performs the write and erase data operations into RAM, the code can be executed while writing and erasing the flash part at the same time. Once the low level functions are downloaded to RAM, the flash can be in any mode. The low level functions are called from RAM instead of the flash memory. Hence, the RAM executes the low level algorithm to perform writes and erases irrespective of what mode the flash is in.

Because the flash memory block can only be placed in one mode at a time, it is not possible to download or read the code from flash to RAM at the same time as a data operation is being performed. If a read or write operation is being performed on data, the operation generally has to be suspended before the code can be read from the flash memory. Thus, every time a read operation is performed on flash, all other operations are usually suspended before the read operation can occur. Specifically, the procedure of suspending a preempted erase operation to perform a preempting read operation is known as a chopped erase.

As a result of being able to perform only one operation at a time on the flash, it is typically necessary to constantly poll for higher priority commands while the low level function is being performed to determine if there is any code that needs to be executed right away. If there is a higher priority command, then an interrupt is executed and the low level function operation is suspended until the preempting operation is completed. However, having to poll for interrupts and suspending tasks prior to servicing interrupts can potentially result in undesirable performance effects such as substantial interrupt latency and periodic chopped erases.

BRIEF DESCRIPTION OF THE DRAWINGS

The following figures depict embodiments of the present invention:

FIG. 2 shows an embodiment of a table of possible preemption scenarios involving low level functions;

DETAILED DESCRIPTION

Figure 1:
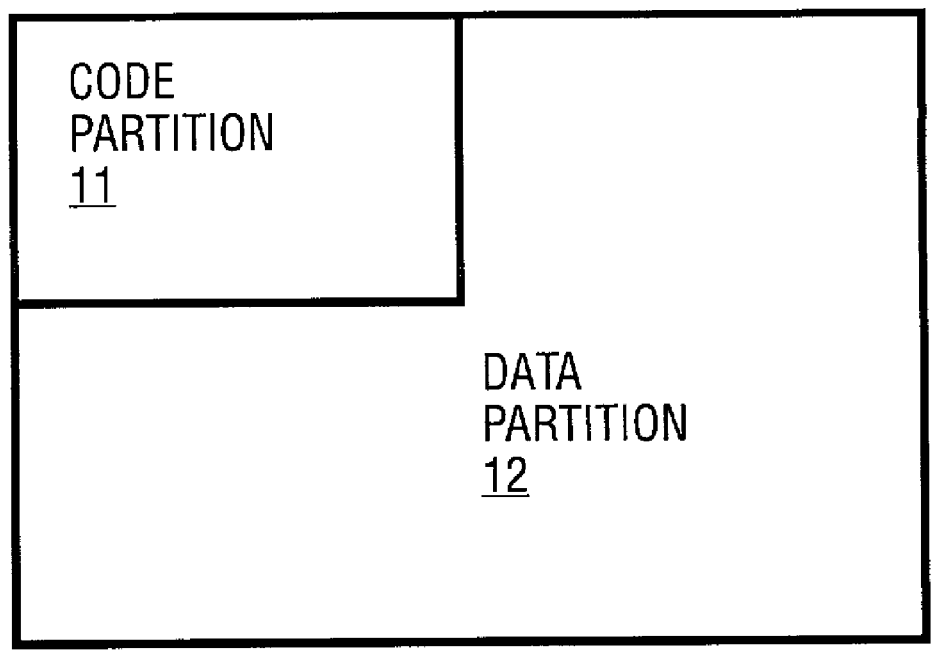
FIG. 1 shows an embodiment of a flash memory with partitions.

A method for implementing accesses to multi-partitioned flash memory with suspend/resume capability is described. In one embodiment of the invention, a dual partitioned flash memory is implemented. FIG. 1 depicts a hardware implementation of a flash memory array 10 with two partitions. In the figure, the partitions are known as the code partition 11 and the data partition 12. The partition sizes may vary depending on the size of the flash memory array. However, once the partition sizes of the flash memory 10 are determined, they are fixed and do not need to be modified. Typically, flash memory array is divided into multiple equal sized blocks. The partitions may be composed of several blocks.

The FDI code is stored in the code partition 11, and the data is stored in the data partition 12. The physical memory spaces of the code partition 11 and data partition 12 are fixed. By keeping the code in a different partition from the data, operations may be performed on each at the same time. For example, the code partition 11 can perform a read operation at the same time the data partition 12 is performing a write operation. The process of reading and writing of one memory block at the time is referred to as a read while write (RWW). The capability of performing multiple operations on one flash memory block is made possible because of the multiple partition implementation. Although FIG. 1 depicts an example with two partitions, the invention is not limited to two partitions. Multiple partitions for code and data may be implemented as long as the code and data partitions do not overlap one another within the memory space.

The operations on a given partition can be performed only after setting the memory partition to an applicable mode that enables the desired operation. For example, the partition must be in read mode when a read operation is desired. Similarly, the partition must be in erase/write mode to initiate an erase or write operation. A third mode is the status mode. In the status mode, the partition status is read from the flash memory. The status mode determines if the flash is busy. Therefore, if the requested partition is performing another task, the status mode indicates that the partition is "busy" and a suspend operation is issued to interrupt the preempted task. Upon completion of the preempting task, the status mode will indicate that the partition is "ready."

Because the code partition 11 is only used to read commands, the code partition is generally kept in read mode. The data partition 12 is used for storing and erasing data. Thus, its mode setting depends on the desired operation.

By enabling processes such as RWW, multiple partitions eliminate the need to poll for interrupts. Without the capability to perform multiple operations at the same time on one flash memory block, the processor is typically required to continuously poll for interrupts in the event that a higher priority task needs to perform an operation while the lower priority task is performing another operation on the same memory address. Since multiple partitions enable multiple operations to be performed on one flash memory array, there is no need to poll for interrupts. This substantially reduces the number of chopped erases. However, forced interrupts are still available when necessary. Even though multiple partitions enable multiple operations to be performed on the same flash memory block, if more than one operation is requested in any given memory partition, a forced interrupt might still be necessary in order to give priority to the more urgent task.

The write and erase operations of the data partition 12 are performed by low level functions. As previously mentioned, the data partition stores only user data files. In contrast, the code partition 11 contains both user application code and the FDI code. The low level functions are part of the FDI code. Without a multi-partition design, the low level functions are downloaded by RAM in order to execute the specified operations while the flash is in status mode or read mode. Because data and code can be stored in different partitions in a multi-partition design, code no longer has to be downloaded to RAM. Instead, code may be read from within the flash memory itself from the code partition 11. This enables faster code access by improving the FDI performance and eliminating the need to read the low level functions from RAM. Efficient performance is especially desirable in applications such as cell phones, where quick responses are valued. For instance, cell phone consumers generally wish to use their phone immediately when the cell phone is turned on rather than having to wait for a long latency period.

In the event that a low level function is requested when another operation is currently being executed within the same partition, the FDI determines which task assumes priority. Write, erase, and read functions are called by reclaim, background, or foreground tasks. Foreground tasks have a higher priority than background tasks. Reclaim tasks have the lowest priority. FIG. 2 shows a table capturing all the possible task preemption possibilities.

The vertical axis 21 represents preempted functions and the horizontal axis 22 represents preempting functions. All table entries containing a "V" indicate that the preempting task will suspend the preempted operation so that the preempting operation can be first executed. In these instances, the preempting task has a higher priority of the preempted task. For example, a preempting background write has priority over a preempted reclaim erase. As a result, a suspend needs to be done on the preempted reclaim erase in order for the preempting background write to be first executed.

However, table entries containing "T," "P," and "S" indicate that the preempting task will not interrupt the preempted task. In these cases, suspend does not need to be performed. Table entries containing "T" indicate the preempting and preempted tasks are the same. No suspend is necessary since the task is already being performed. For example, a reclaim operation cannot preempt another reclaim because there is only one reclaim task in the system. Similarly, table entries containing an "S" indicate that a suspend operation will not occur because the preempting task will assert a semaphore flag. The semaphore flag prevents a write operation from preempting another write operation. Finally, table entries containing a "P" indicate the preempting task is of a lower priority than the preempted task. Therefore, a suspend operation will not be necessary. For example, a reclaim does not preempt a background operation because reclaim is a lower priority task. Note that it is possible that there could be more than one reason for suspend to not be necessary. For example, a preempting reclaim write will not suspend a preempted reclaim write because they are the same task and the semaphore flag would prevent its operation anyways.

Figure 3:
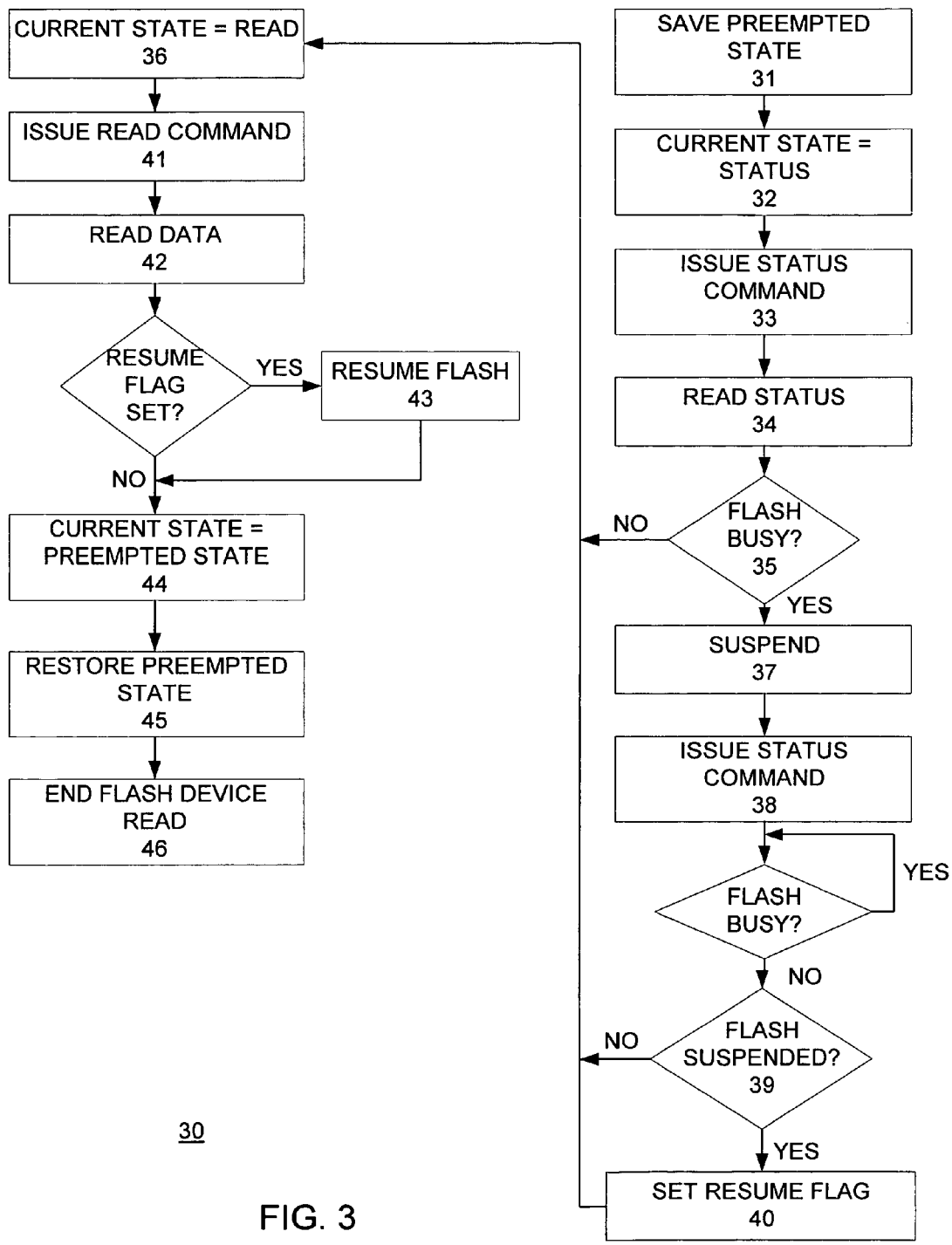
FIG. 3 shows an embodiment of a flowchart of a low level preempting read algorithm.

FIG. 3 depicts a preempting low level read algorithm 30. As shown in FIG. 2, read can preempt a read, a write, or an erase operation. When a preempting read function is received, the preempted state is saved 31. The flash memory partition is placed in the status mode 32. The status commands are then issued 33 and read 34. The low level read checks 35 if a suspend operation is required. If there are no other tasks being performed on the flash memory, the device is placed in read mode 36.

However, if the flash is busy, a suspend command 37 is issued 38 to halt the preempted task. When this occurs and the suspend is successful 39, the function sets a flag 40 indicating that the preempted task must resume the operation upon exit. Operations such as erase or write do not need to complete prior to the suspend command 37; they may be completed following the preempting read function. The flash is placed in the read mode 36 after the suspend operation has been successfully completed 39.

Once the flash memory partition is in read mode 36, the read command is issued 41 enabling data to be read 42. After the data has been read 42, if the flag 40 indicating that the flash must resume a prior operation upon exit is set, the flash is resumed 43 to its previous task. The current state is set to the preempted state 44 and the preempted state is restored 45. The flash device read is then officially completed 46.

Figure 4:
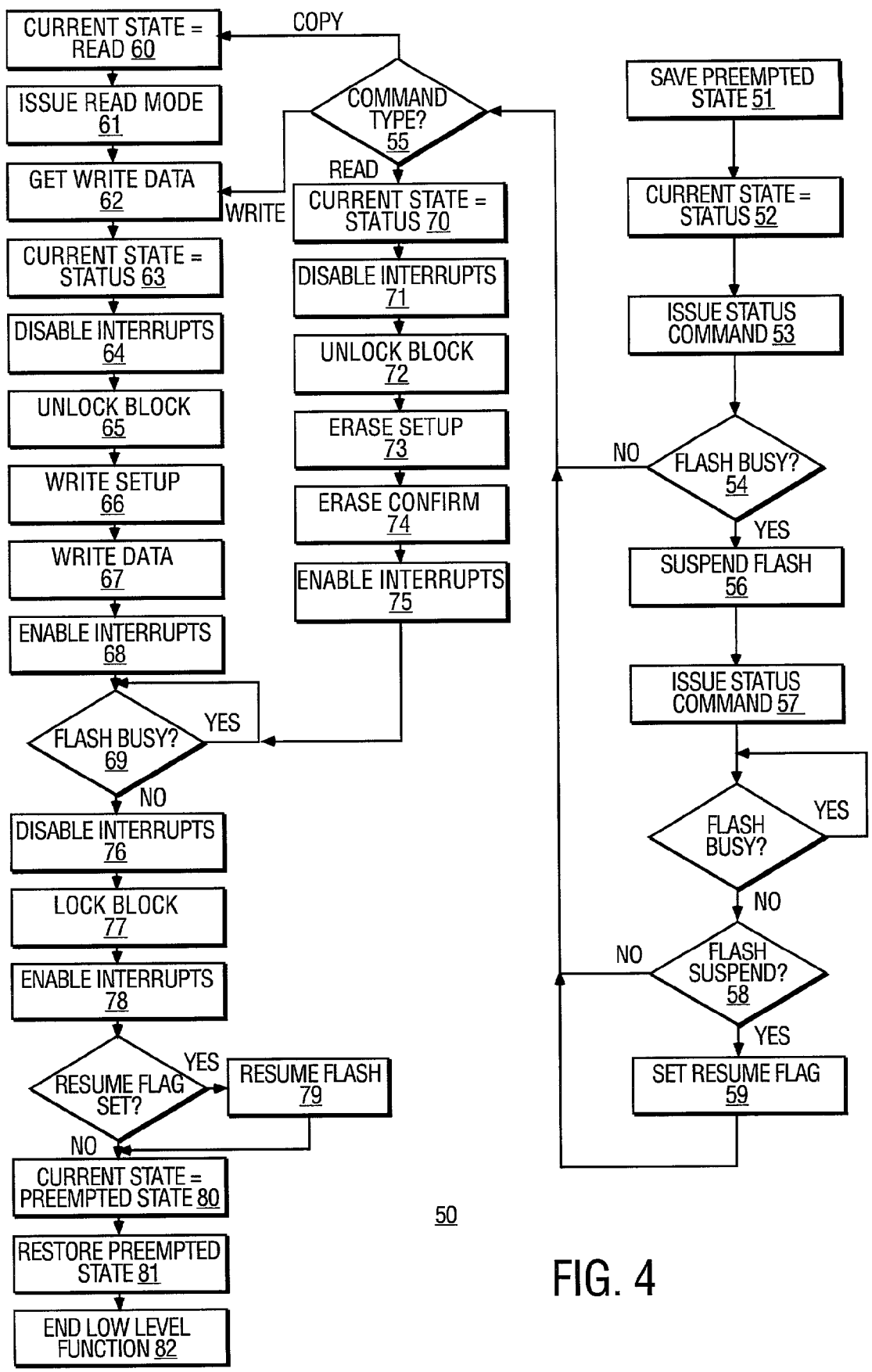
FIG. 4 shows an embodiment of a flowchart of a low level preempting write/erase algorithm.

Like the low level read algorithm 30, a write or an erase operation will follow a similar algorithm if the operation is of a higher priority than a previous operation. FIG. 4 depicts the algorithm for a write or an erase operation 50. When a preempting write or erase operation is received, the preempted state is saved 51. The flash is set to the status mode 52. The status command is issued 53 and it is determined whether the device is busy 54. If the flash memory partition is not busy, then the command type is identified 55.

However, if the flash is busy, the preempted task in the memory partition is suspended 56 and the status command is issued 57. When the preempted task in the flash memory has been suspended 58, the function sets a flag 59 to indicate that the preempted task must resume upon exit of the write/erase operation. The system then identifies the command type 55.

A write/erase operation can consist of three possible command types: copy, write, or erase. When a copy command is requested, the current state is placed in the read mode 60. The read command is issued 61 so that write data may be accessed 62. The current state is then set to the status mode 63. All interrupts are disabled 64 to enable the data to be written without interruption. The flash memory block to be written is then unlocked 65 and a write setup 66 is performed. Once the write setup 66 is completed, the data is written 67 to flash. Interrupts can then be enabled again 68 when the data write command is finished.

The write command involves going through the same steps as the copy command, except its process does not include placing the flash in read mode 60 or having to issue the read command 61. Therefore, when the write command is executed, the write command accesses the data to be written 62 and then proceeds to go through the same steps 63–68 as the copy command.

In contrast, after an erase command is requested, the current state is set to the status mode 70. The interrupts are disabled 71 so that the erase operation will not be interrupted. The memory block is then unlocked 72 and the erase setup 73 is performed. When the erase setup 73 is completed, the erase is confirmed 74. The interrupts are enabled 75 after the flash erase has been completed.

Once the interrupts are enabled following either a copy, write, or erase, the system waits 69 until the flash is not busy. The interrupts are again disabled 76 to lock the flash memory block 77. After the flash memory block has been locked, the interrupts are enabled 78. If the flag 59 indicating that it must resume the operation upon exit is set, the flash is resumed 79 to its previous task. The current state is set to the preempted state 80 and the preempted state is restored 81. The low level function is then completed 82.

In the foregoing specification, the invention has been described with reference to specific exemplary embodiments thereof. It will, however, be evident that various modification and changes may be made thereto without departure from the broader spirit and scope of the invention as set forth in the appended claims. The specification and drawings are, accordingly, to be regarded in an illustrative rather than restrictive sense.

What is claimed is:

1. A method of performing multiple operations on a memory device, comprising:
   performing a read operation on a code partition of the memory device to execute a first function stored as code on the code partition, wherein the first function is executed directly from the code partition without previously reading the first function into random access memory ("RAM") to execute the first function from the RAM;
   performing a first data operation on a data partition of the memory device while performing the read operation on the code partition; and
   suspending the first data operation on the data partition, if the first function executed from the code partition determines that a preempting data operation with priority over the first data operation is detected, wherein the non-volatile memory device includes multiple partitions.

2. The method of claim 1, further comprising resuming operation of the first data operation after completion of the preempting data operation.

3. The method of claim 2, further comprising performing the first data operation of the data partition without suspending the first data operation for a second data operation, if the first function executed from the code partition determines that the second data operation does not have priority over the first data operation.

4. The method of claim 1, wherein the code partition comprises one of the multiple partitions of the non-volatile memory for storing executable code for performing operations on the data partition.

5. The method of claim 2, wherein the first data operation comprises a write operation to write data to the data partition of the memory device.

6. The method of claim 2, wherein the first data operation comprises a read operation to read data from the data partition of the memory device.

7. The method of claim 2, wherein the first data operation comprises a status operation to determine whether the data partition of the memory device is busy.

8. The method of claim 2, wherein the memory device comprises flash memory.

9. The method of claim 8, wherein the flash memory comprises an electrically erasable read only memory ("EEPROM") array.

10. The method of claim 2 wherein the code partition and the data partition of the memory device do not overlap each other in the memory device.

11. The method of claim 2, wherein the code partition and the data partition are fixed in memory space of the memory device.

12. An apparatus, comprising:
    a nonvolatile memory device including at least one data partition and at least one code partition, the code partition storing a first function as code on the code partition; and
    a processor coupled to the nonvolatile memory device, the processor coupled to perform a first data operation on the data partition while performing a read operation on the code partition to execute the first function directly from the code partition, the first function including code executable by the processor to suspend the first data operation on the data partition, if the first function executed by the processor from the code partition determines that a preempting data operation with priority over the first data operation is detected.

13. The apparatus of claim 12, wherein the nonvolatile memory device comprises a flash memory.

14. The apparatus of claim 13, wherein the flash memory comprises an electrically erasable read only memory ("EEPROM") array.

15. The apparatus of claim 12 wherein the code partition and the data partition of the nonvolatile memory device do not overlap each other in the nonvolatile memory device.

16. The apparatus of claim 12, wherein the code partition and the data partition are fixed in memory space of the nonvolatile memory device.

* * * * *